United States Patent [19]
Imai

[11] Patent Number: 5,834,825
[45] Date of Patent: Nov. 10, 1998

[54] SEMICONDUCTOR DEVICE HAVING SPIRAL WIRING DIRECTLY COVERED WITH AN INSULATING LAYER CONTAINING FERROMAGNETIC PARTICLES

[75] Inventor: Kiyotaka Imai, Tokyo, Japan

[73] Assignee: NEC Corporation, Tokyo, Japan

[21] Appl. No.: 773,206

[22] Filed: Dec. 23, 1996

[30] Foreign Application Priority Data

Dec. 27, 1995 [JP] Japan ..................... 7-341636

[51] Int. Cl.⁶ ..................................................... H01L 29/40
[52] U.S. Cl. .......................................... 257/531; 257/788
[58] Field of Search .................................. 257/531, 787, 257/788, 789, 792, 795

[56] References Cited

U.S. PATENT DOCUMENTS

| | | | |
|---|---|---|---|
| 3,798,059 | 3/1974 | Astle et al. ............................... | 117/212 |
| 4,788,624 | 11/1988 | Strange ..................................... | 361/272 |
| 5,095,357 | 3/1992 | Andoh et al. ............................ | 257/379 |
| 5,227,659 | 7/1993 | Hubbard .................................. | 257/531 |

FOREIGN PATENT DOCUMENTS

| | | | |
|---|---|---|---|
| 60-124859 | 7/1985 | Japan . | |
| 61-161747 | 7/1986 | Japan ..................................... | 257/531 |
| 61-179862 | 8/1986 | Japan . | |
| 3-019358 | 1/1991 | Japan ..................................... | 257/531 |
| 3-28758 | 3/1991 | Japan . | |
| 3-178158 | 8/1991 | Japan ..................................... | 257/531 |
| 4-130767 | 5/1992 | Japan ..................................... | 257/531 |
| 4-63653 | 5/1992 | Japan . | |

*Primary Examiner*—David B. Hardy

[57] ABSTRACT

A spiral conductive layer formed over a semiconductor substrate is covered with a ferromagnetic particle containing photo-sensitive polyimide layer, and the ferromagnetic particle containing photo-sensitive polyimide layer is patterned into a ferromagnetic insulating layer inserted between turning portions of the spiral conductive layer through a lithographic process, thereby making the structure of a spiral inductor simple.

5 Claims, 7 Drawing Sheets

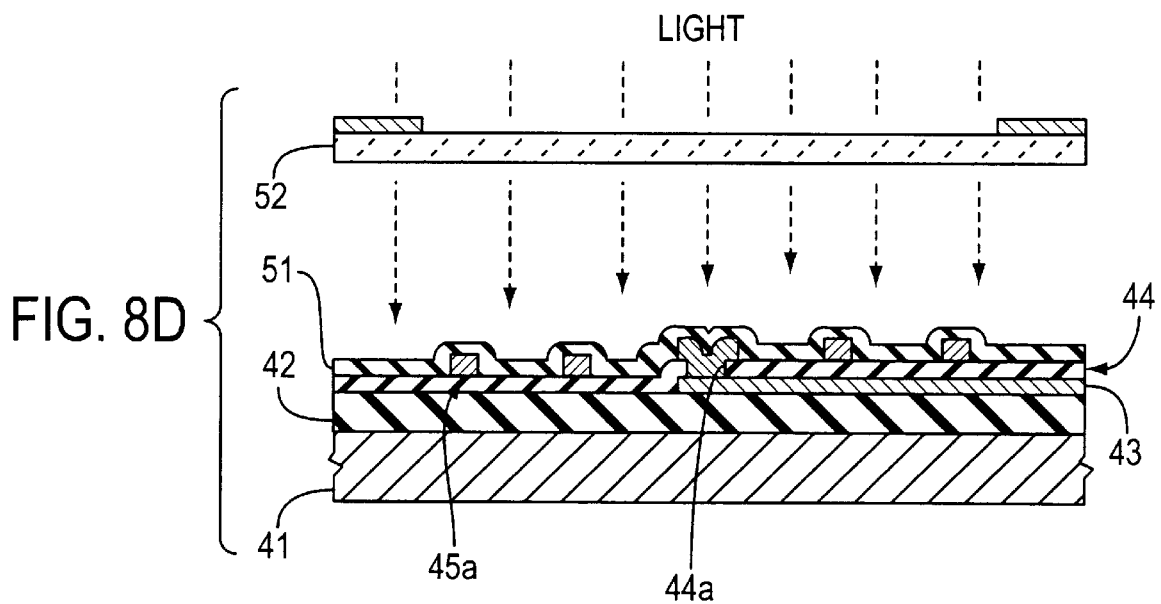
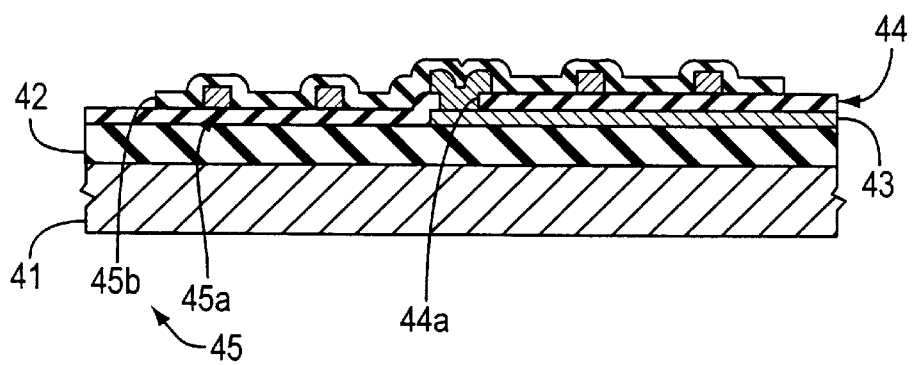

SEMICONDUCTOR DEVICE HAVING SPIRAL WIRING DIRECTLY COVERED WITH AN INSULATING LAYER CONTAINING FERROMAGNETIC PARTICLES

FIELD OF THE INVENTION

This invention relates to a semiconductor device and, more particularly, to a structure of a semiconductor device having a spiral inductor and a process of fabrication thereof.

DESCRIPTION OF THE RELATED ART

An inductor is an important circuit component. A receiver of a radio communication device includes a filter circuit, and the filter circuit is usually implemented by the inductors. If all of the circuit components of the receiver are integrated on a semiconductor chip, the radio communication device is not only scaled down but also reduced in price. If an integrated circuit requires a plurality of electric power sources different in potential level from one another, an on-chip potential transformer steps up or down an external power voltage at high efficiency, and the on-chip potential transformer requires the inductors fabricated on the semiconductor chip.

A typical example of the inductor is a spiral metal wiring. However, when the spiral metal wiring is integrated on a semiconductor chip together with other circuit components, the spiral metal wiring occupies a large amount of real estate on the semiconductor chip so as to achieve an inductance to be required for the circuit, and decreases the integration density.

Some approaches are proposed in Japanese Patent Publication of Unexamined Application Nos. 61-161747, 60-124859 and 61-179562. These Japanese Patent Publications propose inductors implemented by spiral metal wirings, and a ferromagnetic layer serve as a magnetic core. The spiral inductor disclosed in Japanese Patent Publication of Unexamined Application No. 61-161747 is hereinbelow described with reference to FIGS. 1 and 2.

The major surface of a semiconductor substrate 1 is covered with an insulating layer 2 of oxide. A lower conductive wiring 3 is patterned into a spiral configuration on the insulating layer 2, and is hatched in FIG. 1 for better understanding. The spiral lower conductive wiring 3 is topographically covered with a multi-layer structure 4, and the multi-layer structure 4 consists of a lower inter-level insulating layer 4a, an upper inter-level insulating layer 4b and a ferromagnetic strip 4c sandwiched therebetween. The ferromagnetic strip is formed of iron, cobalt, nickel, nickel-iron alloy or cobalt-nickel alloy.

An upper level wiring 5 is patterned on the multi-layer structure 4, and is also hatched in FIG. 1 for better understanding. The upper level wiring 5 passes through a through-hole 4d formed in the multi-layer structure 4, and is held in contact with the inner portion 3a of the spiral lower conductive wiring 3.

The ferromagnetic strip 4c is conductive, and the lower inter-level insulating layer 4a and the upper inter-level insulating layer 4b electrically isolates the ferromagnetic strip 4c from the spiral lower wiring 3 and the upper wiring 5.

The upper wiring 5 is also covered with a multi-layer structure 6 having an insulating layer 6a and a ferromagnetic layer 6b.

The prior art spiral inductor shown in FIGS. 1 and 2 is fabricated on the semiconductor substrate 1 as follows. First, the insulating layer 2 is grown on the major surface of the semiconductor substrate 1, and conductive material is deposited over the entire surface of the insulating layer 2. A photo-resist mask is provided on the conductive layer, and the exposed portion of the conductive layer is etched away. Thus, the conductive layer is patterned into the spiral configuration, and the spiral lower wiring 3 is formed on the insulating layer 2.

Subsequently, insulating material is deposited over the entire surface of the resultant structure, and the spiral lower wiring 3 and the exposed area of the major surface are covered with the lower inter-level insulating layer 4a. Ferromagnetic material is deposited over the lower inter-level insulating layer 4a, and the ferromagnetic material layer is partially etched away for forming the ferromagnetic strip 4c. The etchant removes the ferromagnetic material over the inner end portion 3a of the spiral lower conductive wiring 3.

The insulating material is deposited over the ferromagnetic strip 4c and the exposed area of the lower inter-level insulating layer 4a, and forms the upper inter-level insulating layer 4b. A photo-resist mask is provided on the upper inter-level insulating layer 4b, and exposes the area of the upper inter-level insulating layer 4c over the inner end portion 3a to etchant. The etchant selectively removes the insulating material, and forms the through-hole 4d in the upper/lower inter-level insulating layers 4a/4b.

The conductive material is deposited over the entire surface of the resultant structure, and swells into a conductive layer. The conductive layer is held in contact with the inner portion 3a of the spiral lower conductive wiring 3. A photo-resist mask is provided over the conductive layer, and etchant patterns the conductive layer into the upper level wiring 5. The multi-layer structure 6 is formed as similar to the multi-layer structure 4.

The prior art spiral inductor achieves a large inductance, and occupies a small amount of area of the major surface. However, the prior art spiral inductor encounters a problem in the complicated inter-level isolation between the spiral lower conductive wiring 3 and the upper conductive wiring 5. At least two inter-level insulating layers 4a and 4b are required between the spiral lower conductive wiring 3 and the upper conductive wiring 5, and make the inter-level isolation complicated. In the prior art semiconductor device, the two inter-level insulating layers 4a and 4b are indispensable, because the ferromagnetic strip 4c is conductive.

The prior art process also encounters a problem in inaccurate patterning for the ferromagnetic strip 4c. As described hereinbefore, the ferromagnetic strip 4c is formed of iron, cobalt, nickel, nickel-iron alloy or cobalt-nickel alloy, and the ferromagnetic layer is patterned into the ferromagnetic strip 4c by using an etching. However, the etching technique for the ferromagnetic metal/alloy is not reliable. and the manufacturer suffers from inaccurate geometries of the ferromagnetic strip 4c. Although an ion-milling is available for the patterning, the ion-milling is also inaccurate, and is causative of metal particles undesirable for the semiconductor wafer.

SUMMARY OF THE INVENTION

It is therefore an important object of the present invention to provide a semiconductor device which has a simple isolation between an inductor and an upper wiring.

It is also an important object of the present invention to provide a process of fabricating the semiconductor device through which a ferromagnetic strip is accurately patterned.

To accomplish the object, the present invention proposes to impart ferromagnetism to an inter-level insulating layer.

In accordance with one aspect of the present invention, there is provided a semiconductor device fabricated on a substrate and having an inductor which comprises a first conductive wiring formed into a spiral configuration over the substrate and having a plurality of turning portions contiguous to one another, and a ferromagnetic insulating structure covering the first conductive wiring and having a ferromagnetic insulating layer formed from an insulating material and ferromagnetic particles dispersed in the insulating material and inserted between the plurality of turning portions.

In accordance with another aspect of the present invention, there is provided a process of fabricating a semiconductor device having an inductor, comprising the steps of: a) preparing a substrate having a major surface; b) forming a spiral conductive wiring having a plurality of turning portions over the major surface; c) forming a ferromagnetic particle containing insulating layer over the resultant structure of the step b) so as to provide portions of the ferromagnetic particle containing insulating layer between the plurality of turning portions; and d) patterning the ferromagnetic particle containing insulating layer into a ferromagnetic insulating layer having the portions provided between the plurality of turning portions of the spiral conductive wiring.

BRIEF DESCRIPTION OF THE DRAWINGS

The features and advantages of the semiconductor device and the process according to the present invention will be more clearly understood from the following description taken in conjunction with the accompanying drawings in which:

FIGS. 8A to 8E are cross sectional views showing a process sequence of fabricating the semiconductor device shown in FIG. 7.

DESCRIPTION OF THE PREFERRED EMBODIMENTS

First Embodiment

Figure 1:
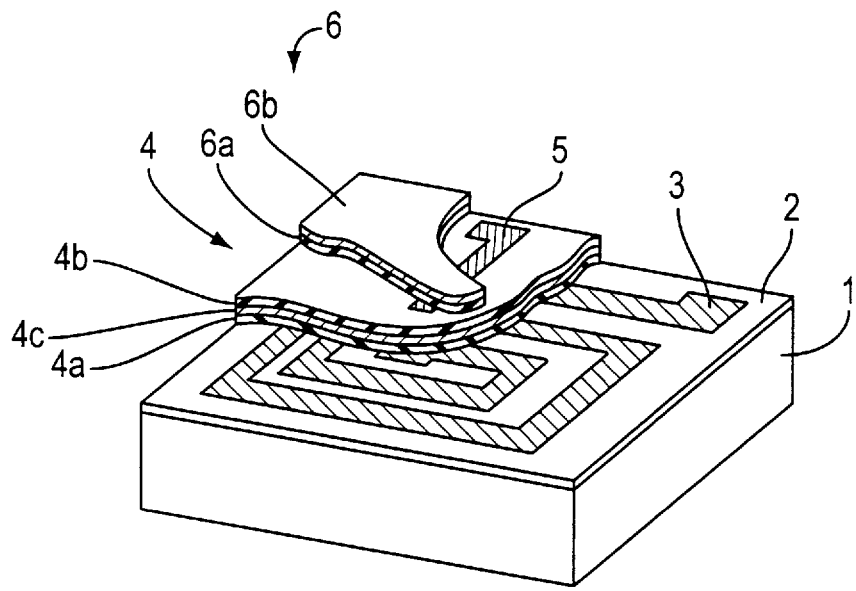
FIG. 1 is a partially cut-way perspective view showing the structure of the prior art spiral inductor.
Figure 2:
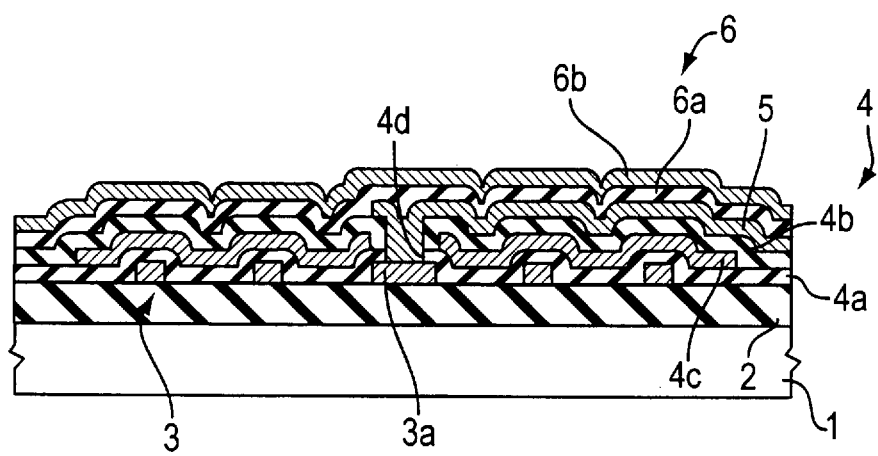
FIG. 2 is a cross sectional view showing the structure of the prior art spiral inductor.
Figure 3:
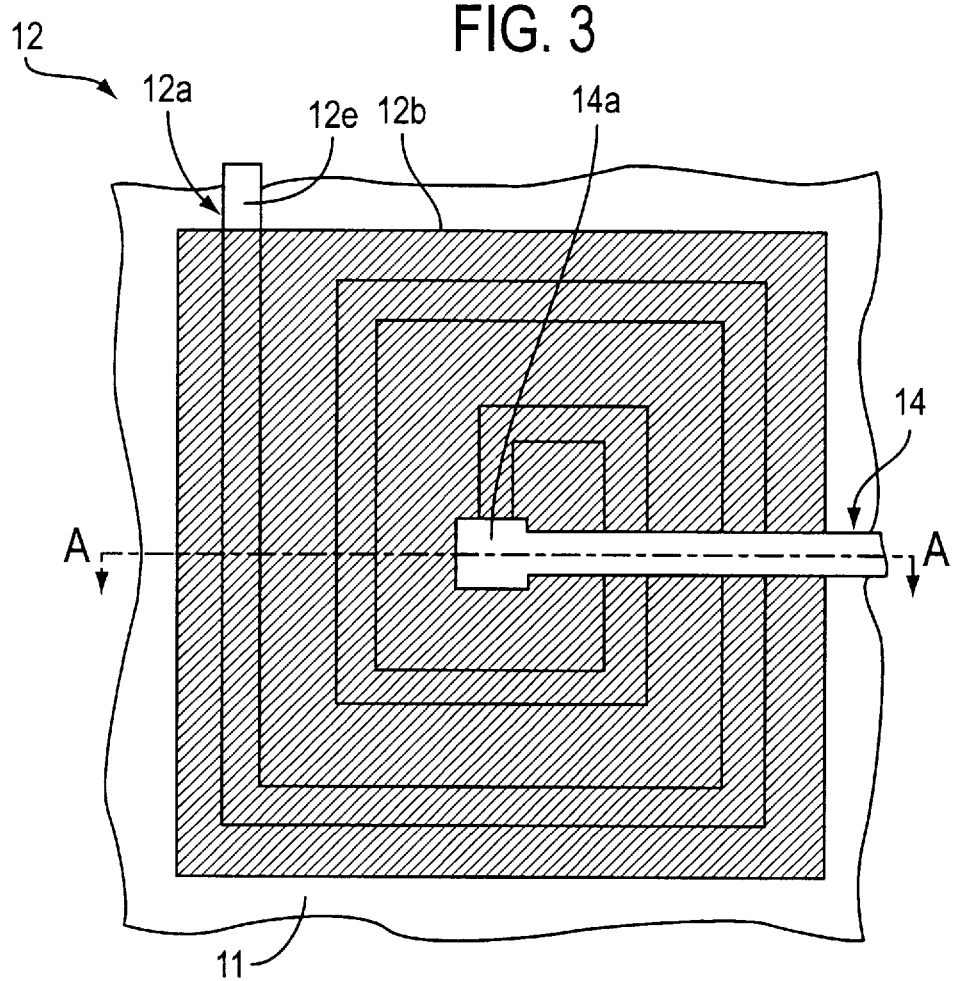
FIG. 3 is a plan view showing the layout of a semiconductor device according to the present invention.
Figure 4:
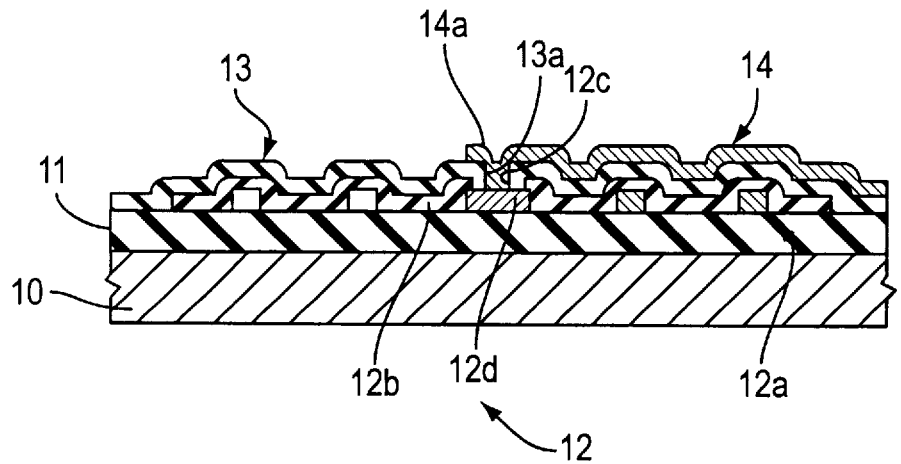
FIG. 4 is a cross sectional view taken along line A—A of FIG. 3 and showing the structure of the semiconductor device.

Referring to FIGS. 3 and 4 of the drawings, a semiconductor device embodying the present invention is fabricated over a semiconductor substrate 10. The semiconductor substrate 10 has a major surface, and the major surface is covered with a lower insulating layer 11. The semiconductor substrate 10 and the lower insulating layer may be formed of silicon and silicon oxide, respectively.

An inductor 12 is fabricated on the lower insulating layer 11. The inductor 12 includes a spiral lower conductive wiring 12a and a ferromagnetic insulating layer 12b. The ferromagnetic insulating layer 12b is hatched in FIG. 3 for easily discriminating it from other components.

The lower conductive wiring 12a is formed of conductive material such as aluminum or copper, and has a spiral configuration. The ferromagnetic insulating layer 12b topographically extends over the major surface and the spiral lower conductive wiring 12a, and covers the spiral lower conductive wiring 12a. A through-hole 12c is formed in a central area of the ferromagnetic insulating layer 12b, and an inner end portion 12d of the spiral lower conductive wiring 12a is exposed to the through-hole 12c.

The ferromagnetic insulating layer 12b is formed of ferromagnetic particle containing insulating material. Photosensitive polyimide is an example of the insulating material, and other examples are insulating materials available for a spin-coating.

The ferromagnetic particles are acicular particles of iron, iron oxide or chromium dioxide or plate-like particles of barrium ferrite. The ratio of ferromagnetic particles to the insulating material range from 1 percent to 10 percent by volume. The particles are of the order of 10 nanometers, and the ferromagnetic insulating layer 12b ranges between 100 nanometers and 200 nanometers thick.

The semiconductor device according to the present invention further comprises an inter-level insulating layer 13 and an upper conductive wiring 14 extending over the inter-level insulating layer 13. Although the inter-level insulating layer 13 is removed from the structure shown in FIG. 3, the inter-level insulating layer 13 electrically isolates the ferromagnetic insulating layer 12b from the upper conductive wiring 14. In this instance, the inter-level insulating layer 13 is formed of silicon oxide, and the upper conductive wiring 14 is formed of aluminum or copper.

The ferromagnetic insulating layer 12a is covered with the inter-level insulating layer 13, and a through-hole 13a is formed in the inter-level insulating layer 13. The through-hole 13a is nested into the through hole 12c, and, for this reason, the inner surface defining the through-hole 12c is covered with the insulating material. The upper conductive wiring 14 has a leading end portion 14a, and the leading end portion 14a is held in contact through the through-hole 13a with the inner end portion 12d. Thus, the upper conductive wiring 14 is electrically connected to the spiral lower conductive wiring 12a, and is electrically isolated from the ferromagnetic insulating layer 12b. An outer end portion 12e of the spiral lower conductive wiring 12a is connected to another circuit component (not shown), and an electric power source (not shown) applies an electric potential between the inner end portion 12d and the outer end portion 12e. Though not shown in the drawings, the upper conductive wiring 14 may be covered with an insulating layer.

The spiral lower conductive wiring 12a is directly covered with the ferromagnetic insulating layer 12b, and no inter-level insulating layer is inserted between the spiral lower conductive wiring 12a and the ferromagnetic insulating layer 12b. Only one inter-level insulating layer 13 is inserted between the ferromagnetic insulating layer 12b and the upper wiring 14, and the semiconductor device according to the present invention is simpler in structure than the prior art semiconductor device. The simple structure reduces the production cost of the semiconductor device.

Description is hereinbelow made on a process of fabricating the semiconductor device with reference to FIGS. 5A to 5E. The process starts with preparation of the semiconductor substrate 10, and the insulating material is grown on the major surface of the semiconductor substrate 10. Other circuit components such as, for example, transistors may be fabricated on the semiconductor substrate 10 before the major surface of the semiconductor substrate 10 is covered with the lower insulating layer 11.

The conductive material is deposited over the entire surface of the lower insulating layer 11, and the lower insulating layer 1 is covered with the conductive layer. Photo-resist solution is spread over the entire surface of the conductive layer, and is baked so as to laminate a photo-resist layer on the conductive layer. A spiral pattern image is optically transferred to the photo-resist layer, and a latent image is formed in the photo-resist layer. The latent image is developed, and a photo-resist etching mask (not shown) is provided on the conductive layer. Using the photo-resist etching mask, the conductive layer is partially etched away, and the spiral lower conductive layer 12a is left under the photo-resist etching mask. The photo-resist etching mask is stripped off. The resultant structure is illustrated in FIG. 5A.

Subsequently, the ferromagnetic insulating layer 12b is formed as follows. In this instance, polyimide is used as the insulating material, and the ferromagnetic particles are selected from the ferromagnetic materials described hereinbefore. The content of the ferromagnetic particles is 10 percent by volume.

Figure 5A:
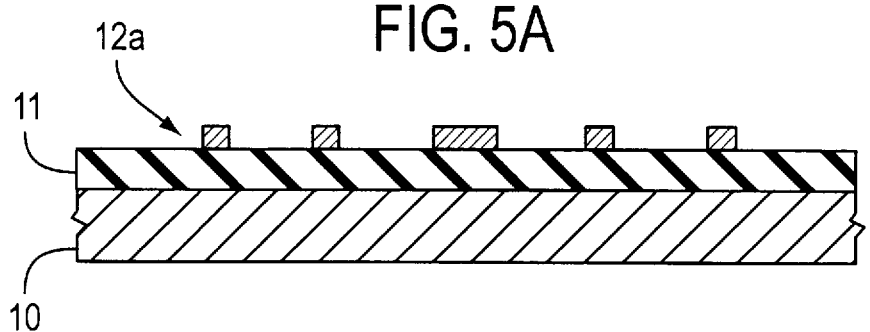
FIGS. 5A to 5E are cross sectional views showing a process sequence of fabricating the semiconductor device according to the present invention.
Figure 5B:
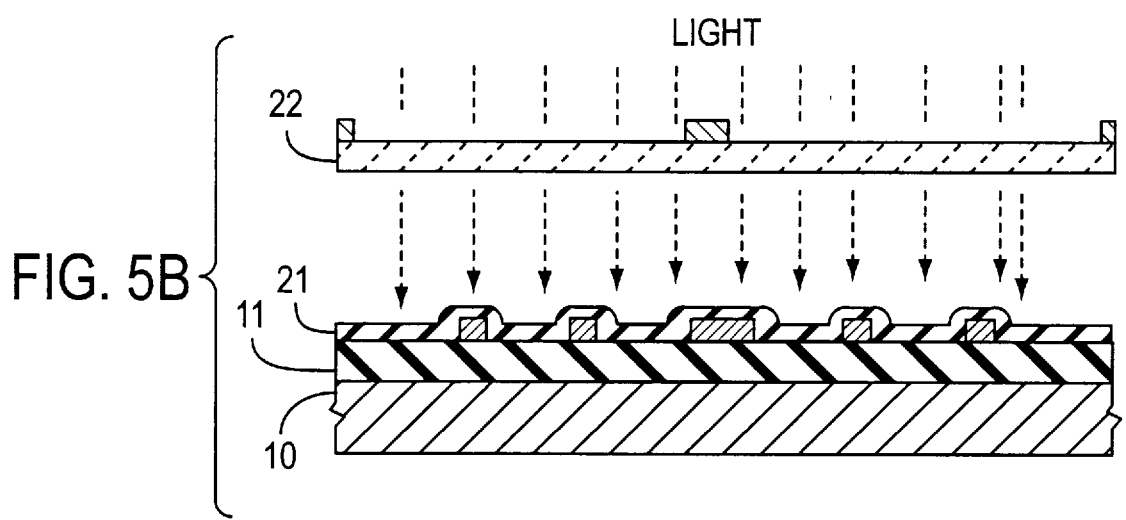

First, the ferromagnetic particles are mixed into photo-sensitive polyimide solution, and the mixture is spread over the entire surface of the resultant structure shown in FIG. 5A. The mixture is dried, and the exposed area of the lower insulating layer 11 and the spiral lower conductive wiring 12a are covered with the ferromagnetic particle containing photo-sensitive polyimide layer 21. The ferromagnetic particles have the grain size of the order of 10 nanometers, and the ferromagnetic particle containing photo-sensitive polyimide layer 21 ranges from 100 nanometers to 200 nanometers thick.

Figure 5C:
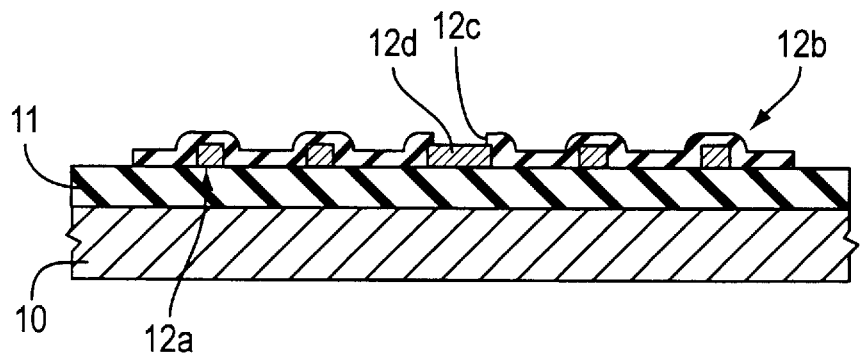

The resultant structure is placed in an aligner, and the ferromagnetic particle containing photo-sensitive polyimide layer 21 is exposed to light through a photo-mask 22. The light carries a pattern image, and a latent image is formed in the ferromagnetic particle containing photo-sensitive polyimide layer 21. The latent image is developed in developing solution such as, for example, organic solvent, and the ferromagnetic particle containing photo-sensitive polyimide layer 22 is patterned into the ferromagnetic insulating layer 12b. The etching technique on the polyimide is reliable, and the pattern reproducibility is more accurate than that of the prior art process. The inner end portion 12d is exposed to the through-hole 12c formed in the ferromagnetic insulating layer 12b. The resultant structure is illustrated in FIG. 5C.

Subsequently, silicon oxide is deposited over the entire surface of the resultant structure shown in FIG. 5C by using a chemical vapor deposition, and a silicon oxide layer 23 is formed over the resultant structure.

Figure 5D:
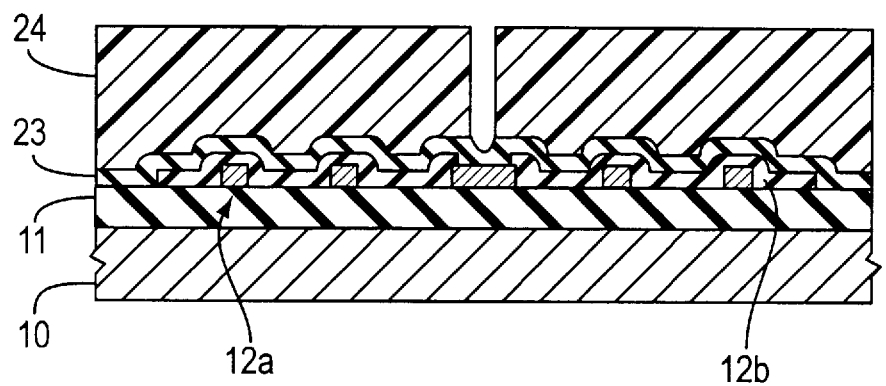

Photo-resist solution is spread over the entire surface of the silicon oxide layer 23, and is baked so as to form a photo-resist layer. A pattern image is optically transferred to the photo-resist layer so as to form a latent image in the photo-resist layer, and is developed into a photo-resist etching mask 24 as shown in FIG. 5D.

The photo-resist etching mask 24 exposes a part of the silicon oxide layer 23 to an etchant, and the through-hole 13a is formed in the inter-level insulating layer 13. The ferromagnetic insulating layer 12b is accurately patterned, and the through-hole 13a is surely nested into the through-hole 12c.

Figure 5E:
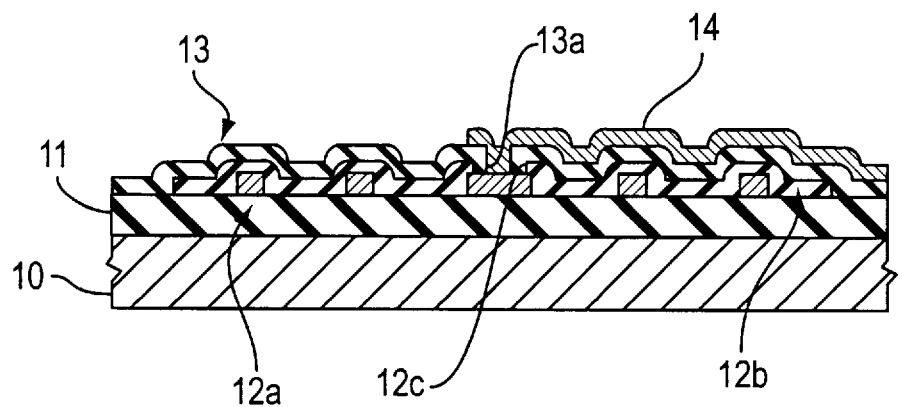

The conductive material is deposited over the entire surface of the resultant structure, and a photo-resist etching mask (not shown) is provided on the conductive material layer through the lithographic process. Using the photo-resist etching mask, the conductive material layer is partially etched away, and the upper conductive wiring 14 is left on the inter-level insulating layer 13 as shown in FIG. 5E.

After the patterning of the upper conductive wiring 14, the resultant structure may be covered with an insulating layer.

The present inventor evaluated the spiral inductor 12 as follows. First, the spiral inductor 12 was fabricated through the process described hereinbefore. The spiral lower conductive wiring 12a was 4 microns in width, and had five turns. Each turn was spaced from the adjacent turn by 8 microns. The ferromagnetic insulating layer 12b contained the ferromagnetic particles at 10 percent by volume, and the magnetic permeability of the ferromagnetic insulating layer 12b was five hundred times larger than that of the silicon oxide.

The present inventor further fabricated a comparative example which had a lower spiral conductive wiring same as the spiral lower conductive wiring 12a; however, the comparative example did not have the ferromagnetic insulating layer 12b. The spiral inductor 12 occupied the real estate equal to that of the comparative example.

The comparative example achieved 1.8 nH. On the other hand, the inductance of the spiral inductor 12 was 90 nH which was fifty times larger than that of the comparative example.

As will be appreciated from the foregoing description, the semiconductor device according to the present invention is simpler in structure than the prior art semiconductor device by virtue of the ferromagnetic insulating layer 12b. Moreover, the ferromagnetic insulating layer 12b is patterned from the ferromagnetic particle containing photo-sensitive polyimide layer, and the patterning technique on the polyimide is reproducible rather than the ferromagnetic material. For this reason, the process according to the present invention is reliable rather than the prior art process.

Second Embodiment

Figure 6:
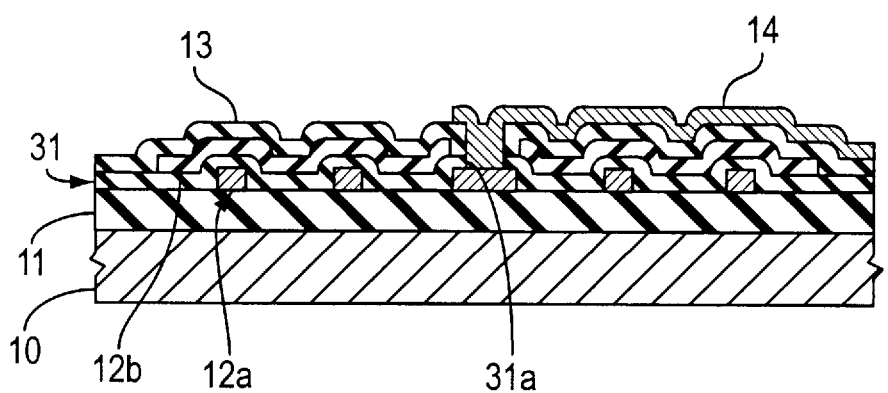
FIG. 6 is a cross sectional view showing the structure of another semiconductor device according to the present invention.

FIG. 6 illustrates another semiconductor device embodying the present invention. The semiconductor device implementing the second embodiment is similar to the first embodiment except for a lower inter-level insulating layer 31. The other layers and wirings of the second embodiment are labeled with the references same as those of the first embodiment without detailed description.

If the ferromagnetic insulating layer 12b is getting thin, the ferromagnetic insulating layer 12b is liable to lose the electrical insulation. The lower inter-level insulating layer 31 is inserted between the spiral lower conductive wiring 12a and the ferromagnetic insulating layer 12b, and is desirable for a thin ferromagnetic insulating layer.

The lower inter-level insulating layer 31 is not merely enhances the electrical isolation, but regulates the inductance of the spiral inductor according to the present invention. In the first embodiment, the ferromagnetic insulating layer is held in contact with the lower insulating layer between the turns of the spiral lower conductive wiring 12a. However, the lower inter-level insulating layer 31 is held in contact with the lower insulating layer 11 between the turns of the lower spiral conductive layer 12a in the second embodiment, and the amount of ferromagnetic insulating material between the turns is regulable by changing the thickness of the lower inter-level insulating layer 31. Therefore, the lower inter-level insulating layer 12b serves as an inductance regulator.

In order to form the lower inter-level insulating layer 31, the following steps are inserted between the patterning step of the spiral lower conductive layer 12a and the formation of the ferromagnetic particle containing photo-sensitive polyimide. Insulating material such as silicon oxide is deposited over the spiral lower conductive layer 12a, and a photo-resist etching mask (not shown) is provided on the insulating material layer through the lithographic process. Using the photo-resist etching mask, a through hole 31a is formed in the lower inter-level insulating layer 31.

Third Embodiment

Figure 7:
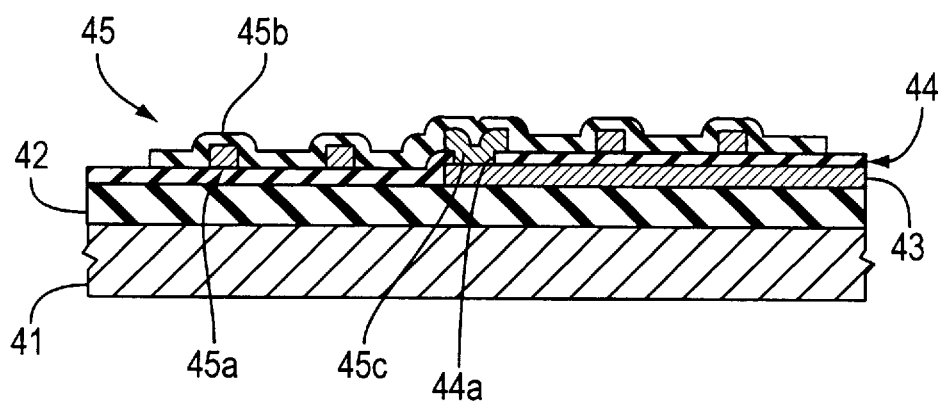
FIG. 7 is a cross sectional view showing the structure of yet another semiconductor device according to the present invention.

Turning to FIG. 7 of the drawings, yet another semiconductor device embodying the present invention is fabricated on a semiconductor substrate 41. The major surface of the semiconductor substrate 41 is covered with a lower insulating layer 42, and a conductive strip 43 extends on the lower insulating layer 42. The conductive strip 42 is covered with an inter-level insulating layer 44, and a through-hole 44a is formed in the inter-level insulating layer 44. A part of the conductive strip 42 is exposed to the through-hole 44a.

A spiral inductor 45 is fabricated on the inter-level insulating layer 44, and includes a spiral conductive wiring 45a patterned on the inter-level insulating layer 44 and a ferromagnetic insulating layer 45b covering the upper and side surfaces of the spiral conductive wiring 45a. The ferromagnetic insulating layer 45b is also formed of ferromagnetic particle containing insulating material, and the insulating material and the ferromagnetic materials described in conjunction with the first embodiment are available for the ferromagnetic insulating layer 45b.

The inner end portion 45c penetrates through the through-hole 44a, and is held in contact with the conductive strip 43. Thus, the spiral conductive wiring 45a is formed over the conductive strip 43 corresponding to the upper conductive wiring 14.

The semiconductor device implementing the second embodiment has only one inter-level insulating layer which isolates the conductive strip 43 from the spiral conductive layer 45a. The semiconductor device implementing the second embodiment achieves all the advantages of the first embodiment. Moreover, even if the ferromagnetic insulating layer 45b gets thinner, no inter-level insulating layer is required between the spiral conductive layer 45a and the ferromagnetic insulating layer 45b. If the spiral inductor 45 has an inductance different from a target value, the manufacturer removes the ferromagnetic insulating layer 45b, and forms a ferromagnetic insulating layer different in content of the ferromagnetic particles from the previous ferromagnetic insulating layer 45b. Thus, the inductance of the spiral inductor 45 is regulable on the semiconductor substrate 41. Though not shown in the drawings, the ferromagnetic insulating layer 45b may be covered with an insulating layer.

Figure 8A:
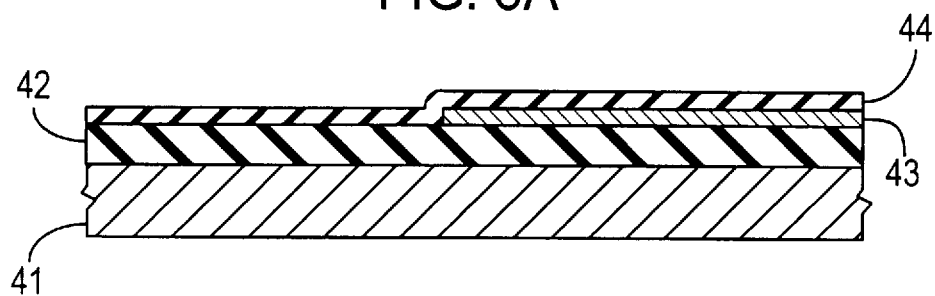

The semiconductor device shown in FIG. 7 is fabricated as follows. The process starts with preparation of the semiconductor substrate 41. The lower insulating layer 42 is grown on the major surface of the semiconductor substrate 41. The semiconductor substrate 41 and the lower insulating layer 42 may be formed of silicon and silicon oxide. Conductive material or semiconductive material is deposited over the entire surface of the lower insulating layer 42, and a photo-resist etching mask (not shown) is formed on the conductive/semiconductive material layer through the lithographic process. The photo-resist etching mask selectively exposes the conductive/semiconductive material layer to etchant, and the conductive/semiconductive material layer is patterned into the conductive strip 43. Insulating material is deposited over the entire surface of the resultant structure, and the conductive strip 43 and the exposed surface of the lower insulating layer 42 are covered with the inter-level insulating layer 44 as shown in FIG. 8A.

Figure 8B:
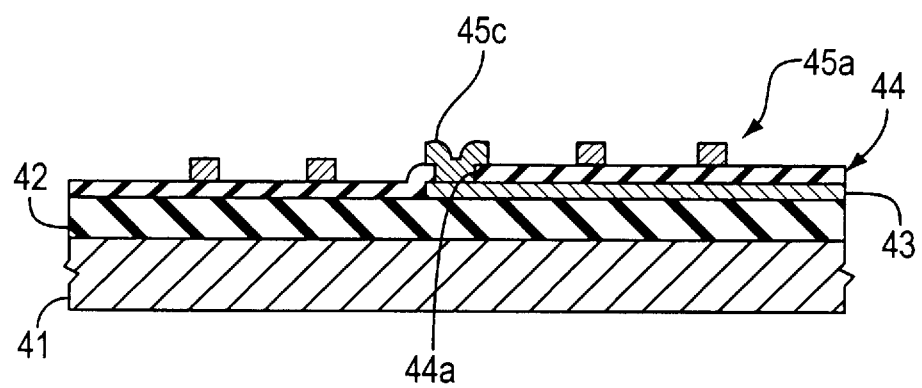

Subsequently, the through-hole 44a is formed in the inter-level insulating layer 44 by using the lithographic process followed by an etching, and conductive material is deposited over the entire surface of the resultant structure. The conductive material fills the through-hole 44a, and swells into a conductive material layer. The lithographic process is repeated, and a spiral photo-resist etching mask (not shown) is formed on the conductive material layer. Using the spiral photo-resist etching mask, the conductive material layer is patterned into the spiral conductive layer 45a as shown in FIG. 8B. The inner end portion 45c of the spiral conductive layer 45a passes through the through-hole 44a, and is held in contact with the conductive strip 43.

Figure 8C:
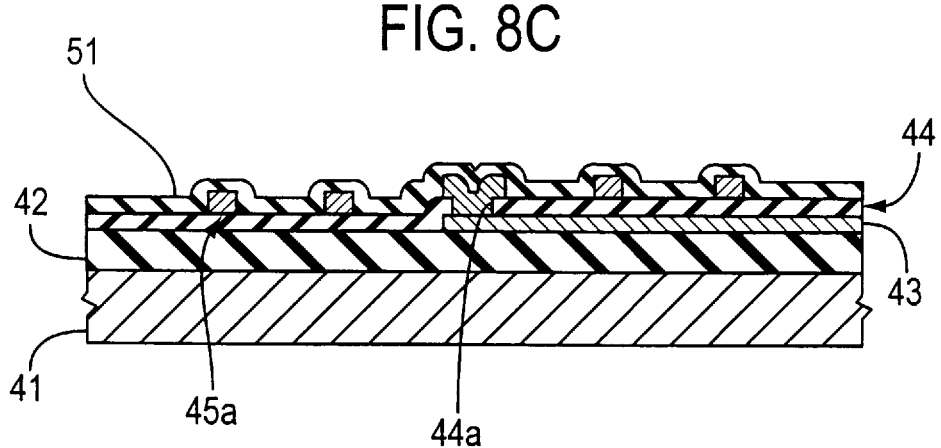

Subsequently, the ferromagnetic particle containing photo-sensitive polyimide is spread over the entire surface of the resultant structure shown in FIG. 8B, and is dried so as to cover the spiral conductive layer 45a and the exposed surface of the inter-level insulating layer 44 with a ferromagnetic particle containing photo-sensitive polyimide layer 51 as shown in FIG. 8C.

The resultant structure shown in FIG. 8C is placed in an aligner (not shown), and a photo-mask 52 is aligned with the resultant structure. Light is radiated through the photo-mask 52 to the ferromagnetic particle containing photo-sensitive polyimide layer 51 (see FIG. 8D), and a latent image is formed in the ferromagnetic particle containing photo-sensitive polyimide layer 51 for the ferromagnetic insulating layer 45b.

The latent image is developed, and the ferromagnetic particle containing photo-sensitive polyimide layer 51 is patterned into the ferromagnetic insulating layer 45b as shown in FIG. 8E. Though not shown in the drawings, after the patterning of the ferromagnetic particle containing photo-sensitive polyimide layer 51, insulating substance may be deposited over the entire surface of the resultant structure.

Thus, the ferromagnetic insulating layer 45b is accurately patterned through the lithographic process.

Although particular embodiments of the present invention have been shown and described, it will be obvious to those skilled in the art that various changes and modifications may be made without departing from the spirit and scope of the present invention.

For example, the inductor according to the present invention may be integrated on a semiconductor substrate together with other circuit components. The other circuit components may be fabricated on the lower insulating layer, under the lower insulating layer or on the lower insulating layer. Namely, the inductor may be fabricated on a different level from the other circuit components or on the same level as the inductor.

The inductor may be directly fabricated on an insulating substrate. The semiconductor device implementing the first embodiment has the inter-level insulating layer 13 between the ferromagnetic insulating layer 13 and the upper conductive wiring 14. However, the inter-level insulating layer 13 may be deleted from the structure so as to directly form the upper conductive wiring on the ferromagnetic insulating layer 12b.

If the insulating material is not photo-sensitive, a photo-resist etching mask is provided on the ferromagnetic particle containing insulating layer.

The spiral conductive wiring may be formed of another metal or semiconductor material.

Non-photosensitive polyimide may be used. In this instance, a non-photosensitive polyimide layer is overlain by a positive photo-resist layer before the baking step, and a pattern image is optically transferred to the positive photo-resist layer for forming a latent image. The photo-illuminated portion of the positive photo-resist is removed through a development, and the non-photosensitive polyimide is also removed.

What is claimed is:

1. A semiconductor device fabricated on a substrate and having an inductor, said inductor comprising:
    a first conductive wiring formed into a spiral configuration over said substrate, and having a plurality of turning portions contiguous to one another,
    a ferromagnetic insulation structure covering said first conductive wiring, and having a ferromagnetic insulating layer formed from an insulating material and ferromagnetic particles dispersed in said insulating material and inserted between said plurality of turning portions, and
    an inductance regulator operative to change the amount of ferromagnetic insulating layer between said plurality of turning portions for regulating the inductance of said inductor.

2. A semiconductor device fabricated on a substrate and having an inductor, said inductor comprising:
    a first conductive wiring formed into a spiral configuration over said substrate, and having a plurality of turning portions contiguous to one another,
    a ferromagnetic insulating structure covering said first conductive wiring, and having a ferromagnetic insulating layer formed from an insulating material and ferromagnetic particles dispersed in said insulating material and inserted between said plurality of turning portions,
    a second conductive wiring formed over said first conductive wiring and is electrically connected to one end portion of said first conductive wiring so that electric current flows between said one end portion and the other end portion of said first conductive wiring, and
    said ferromagnetic structure further including an insulating layer covering said ferromagnetic insulating layer and having a through-hole so as to cause said second conductive wiring to be held in contact with said one end portion therethrough.

3. A semiconductor device fabricated on a substrate and having an inductor, said inductor comprising
    a first conductive wiring formed into a spiral configuration over said substrate, and having a plurality of turning portions contiguous to one another, and
    a ferromagnetic insulating structure covering said first conductive wiring, and having a ferromagnetic insulating layer formed from an insulating material and ferromagnetic particles dispersed in said insulating material and inserted between said plurality of turning portions, wherein said ferromagnetic structure includes an insulating layer provided between said first conductive wiring and said ferromagnetic insulating layer.

4. The semiconductor device as set forth in claim 3, in which said insulating layer serves as an inductance regulator operative to change the amount of ferromagnetic insulating layer between said plurality of turning portions for regulating the inductance of said inductor.

5. A semiconductor device fabricated on a substrate and having an inductor, said inductor comprising:
    a first conductive wiring formed into a spiral configuration over said substrate, and having a plurality of turning portions contiguous to one another,
    a ferromagnetic insulating structure covering said first conductive wiring, and having a ferromagnetic insulating layer formed from an insulating material and ferromagnetic particles dispersed in said insulating material and inserted between said plurality of turning portions,
    a second conductive wiring formed over said first conductive wiring and is electrically connected to one end portion of said first conductive wiring so that electric current flows between said one end portion and the other end portion of said first conductive wiring, and
    an inter-level insulating layer inserted between said first conductive wiring and said second conductive wiring and having a through-hole so as to cause said one end portion to be held in contact with said second conductive wiring therethrough.

* * * * *